United States Patent
Jung

(10) Patent No.: US 8,610,457 B2
(45) Date of Patent: Dec. 17, 2013

(54) TERMINATION CONTROL CIRCUIT AND SEMICONDUCTOR DEVICE INCLUDING THE SAME

(75) Inventor: Jong-Ho Jung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 190 days.

(21) Appl. No.: 13/332,656

(22) Filed: Dec. 21, 2011

(65) Prior Publication Data

US 2012/0217990 A1    Aug. 30, 2012

(30) Foreign Application Priority Data

Feb. 28, 2011   (KR) .................. 10-2011-0017659

(51) Int. Cl.
*H03K 19/003*    (2006.01)
(52) U.S. Cl.
USPC ............................. 326/30; 326/26; 365/206

(58) Field of Classification Search
USPC ................... 326/26, 30, 82, 86; 365/198, 206
See application file for complete search history.

(56) References Cited

U.S. PATENT DOCUMENTS

| | | | |
|---|---|---|---|
| 7,239,560 B2 * | 7/2007 | Lee et al. | 365/189.05 |
| 2010/0302893 A1 * | 12/2010 | Sato et al. | 365/227 |
| 2011/0062984 A1 * | 3/2011 | Kuwahara et al. | 326/30 |

* cited by examiner

*Primary Examiner* — Daniel D Chang
(74) *Attorney, Agent, or Firm* — IP & T Group LLP

(57) ABSTRACT

The semiconductor device includes a termination control unit configured to generate a termination enable signal and termination resistance information in response to termination activation information, dynamic activation information, normal resistance information, and dynamic resistance information wherein the termination enable signal is activated when a delay lock loop is inactivated, and a termination unit configured to be controlled in response to the termination enable signal and terminate an interface pad by using a resistance value determined by the termination resistance information.

18 Claims, 2 Drawing Sheets

TERMINATION CONTROL CIRCUIT AND SEMICONDUCTOR DEVICE INCLUDING THE SAME

CROSS-REFERENCE TO RELATED APPLICATIONS

The present application claims priority of Korean Patent Application No. 10-2011-0017659, filed on Feb. 28, 2011, which is incorporated herein by reference in its entirety.

BACKGROUND

1. Field

Exemplary embodiments of the present invention relate to a semiconductor device and more particularly, a semiconductor device for controlling a dynamic termination operation.

2. Description of the Related Art

As the capacity and speed of a semiconductor memory device, e.g., Dynamic Random Access Memory (DRAM) is increased and a Double Data Rate Static Dynamic Random Access Memory (DDR SDRAM) is widely used, various new concepts for more increasing a transmission rate of a memory device have been introduced. Among those, a resistance of a termination end is typically employed for smoothly transmitting signals among devices.

In this case, when an impedance-matching is not appropriately provided, the transmitted signals may be reflected and thus, errors may occur during signal transmission. However, when a fixed resistance is applied to the outside, the impedance-matching may not be provided due to aging or temperature change of an integrated circuit or a deviation in a manufacturing process. Therefore, in order to make resistance values equal to each other by comparing with an external reference resistance, a technology for regulating the resistance of the termination end by controlling the number of turned-on transistors among a plurality of transistors connected in parallel has been proposed.

A termination control circuit includes a circuit for controlling activation/inactivation timings of an operation of on die termination, i.e., controlling activation/inactivation timings of a termination circuit (hereinafter, referred to as "a termination").

According to specifications defined in JEDEC, it is required to support a dynamic on die termination operation (dynamic ODT, hereinafter, referred to as "a dynamic termination") in a DDR3 SDRAM. The dynamic termination operation includes an operation in which, when a write command is inputted, without resetting of a mode register, the termination resistance in a chip is set to a termination resistance value required at the time of inputting data.

An interface of the semiconductor memory device has different termination types and resistance values at the time to inputting and outputting data. That is, at the time of outputting data, an input/output (DQ) pad is pull-up or pull-down terminated to output logic 'high' or logic 'low' data. At the time of inputting data, the input/output pad is pull-up and pull-down terminated by a predetermined resistance value which is different from the resistance value at the time of outputting data. Here, the termination regulation at the time of inputting or outputting data is slightly different according to a type of memory devices. The termination circuit in the chip may perform an operation for the data input in response to only the write command in the DDR3 memory device supporting the dynamic termination (dynamic ODT) operation.

That is, a termination control circuit simply serves to control the activation/inactivation of the termination circuit before employing the DDR3, but needs to additionally support the dynamic termination operation in the DDRS memory device.

Therefore, the termination control circuit used in DDR3 memory device activates/inactivates a general termination operation and activates/inactivates the dynamic termination operation.

The difference between the termination operation and the dynamic termination operation will be described hereinafter. The termination operation is controlled at both of inputting and outputting data and is performed in the remaining chips other than chips to and from which data are input/output among a plurality of chips sharing the same input/output pads. The dynamic termination operation is controlled at the time of inputting data and is performed in the chips from which data are inputted among the plurality of chips sharing the same input/output pads.

However, in the DRAM, the termination operation may not be guaranteed when a delay lock loop (DLL) included in the DRAM is inactivated. Therefore, when the write operation is performed if the delay lock loop is inactivated, the impedance matching for the termination end may be not provided, thereby causing an error in writing data.

SUMMARY

Exemplary embodiments of the present invention are directed to a semiconductor device capable of controlling a dynamic termination operation even when a delay lock loop is inactivated.

In accordance with an exemplary embodiment of the present invention, a semiconductor device includes a termination control unit configured to generate a termination enable signal and termination resistance information in response to termination activation information and, dynamic activation information, normal resistance information, and dynamic resistance information, wherein the termination control unit activates the termination enable signal when a delay lock loop is inactivated, and a termination unit configured to be controlled in response to the termination enable signal and terminate an interface pad by a resistance value determined by using the termination resistance information.

The termination control unit may include an enable signal generation unit configured to generate the termination enable signal in response to the termination activation information, the dynamic activation information, and a delay lock disable signal indicating whether the delay lock loop is inactivated, and a resistance information generation unit configured to transmit one of the normal resistance information or the dynamic resistance information as the termination resistance information in response to the termination signal, the dynamic termination signal, and the delay lock disable signal.

In accordance with another embodiment of the present invention, a termination control circuit includes an enable signal generation unit configured to generate termination enable signal in response to a termination signal, a termination disable signal, a dynamic termination signal, a dynamic termination disable signal, and a delay lock disable signal indicating whether a delay lock loop is inactivated, and a resistance information generation unit configured to transmit one of the normal resistance information or the dynamic resistance information as the termination resistance information in response to the termination signal, the dynamic signal, and the delay lock disable signal.

DETAILED DESCRIPTION

Figure 1:
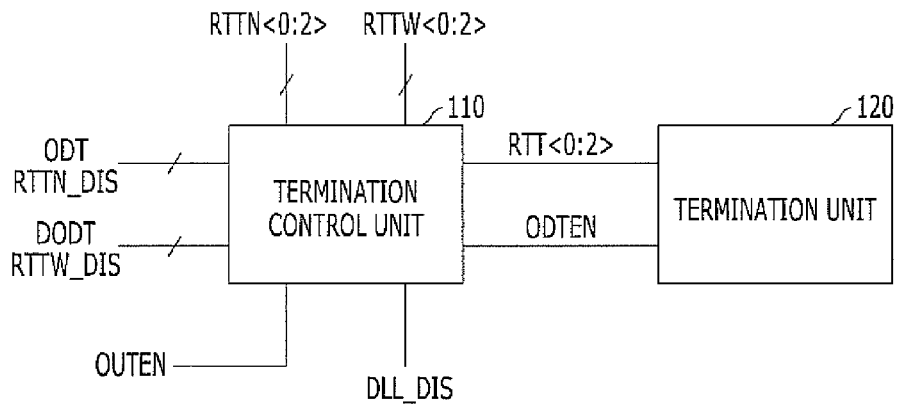
FIG. 1 is a block diagram of showing a semiconductor device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Hereinafter, exemplary embodiments of the present invention will be described with reference to the accompanying drawings so that a person with an ordinary skilled in the art to which the present invention pertains can easily carry out technical ideas of the present invention.

FIG. 1 is a block diagram of showing a semiconductor device in accordance with an exemplary embodiment of the present invention.

As illustrated in FIG. 1, the semiconductor device includes a termination control unit 110 and a termination unit 120. The termination control unit 110 generates a termination enable signal ODTEN and termination resistance information RTT<0:2> in response to termination activation information ODT and RTTN_DIS, dynamic activation information DODT and RTTW_DIS, normal resistance information RTTN<0:2>, and dynamic resistance information RTTW<0:2>. Here, the termination control unit 110 activates the termination enable signal ODTEN when a delay lock loop (not illustrated in FIG. 1) is inactivated. The termination unit 120 is turned-on/off by the termination enable signal ODTEN and terminates an interface pad (not illustrated in FIG. 1) by using a resistance value determined by the termination resistance information RTT<0:2>.

Hereinafter, an operation of the semiconductor device in accordance with the exemplary embodiment of the present invention will be described with reference to FIG. 1.

The termination operation may be performed for terminating an interface pad, to and from which a signal is input and output, in a typical semiconductor device. However, when the semiconductor device is a memory device, the interface pad is a data input/output pad and a signal input and output through the interface pad becomes data. A case in which the semiconductor device is a memory device will be described hereinafter.

The semiconductor device performs a termination operation and a dynamic termination operation when the data are input and output. A case in which the semiconductor device performs the termination operation and a case in which the semiconductor device performs the dynamic termination operation will be separately described hereinafter.

(1) When the semiconductor device performs the termination operation:

As described in the related art, semiconductor devices other than the semiconductor devices for inputting and outputting the data, among the plurality of semiconductor devices sharing the interface pad for inputting and outputting the data, perform a termination operation.

The termination control unit 110 activates the termination enable signal ODTEN in response to termination activation information ODT and RTTN_DIS. The termination activation information ODT and RTTN_DIS includes the termination signal ODT and the termination disable signal RTTN_DIS. The termination signal ODT is a signal input from the outside through a pin, when the termination operation is performed in the outside and is activated at the time of the termination operation. A termination disable signal RTTN_DIS is a signal determined by MRS setting stored in a mode register set (MRS) and is activated when the termination operation is inactivated.

The termination control unit 110 transmits normal resistance information RTTN<0:2> as the termination resistance information RTT<0:2>. The normal resistance information RTTN<0:2> is a signal determined by the MRS setting and represents information relating to a target resistance value for terminating the interface pad by.

At the time of the termination operation, the termination unit 120 terminates the interface pad by using the resistance value determined by the termination resistance information RTT<0:2> in response to the activated termination enable signal ODTEN. The termination unit 120 typically includes a pull-up termination unit and a pull-down termination unit. The pull-up termination unit pull-up drives the interface pad and the pull-down termination unit pull-down drives the interface pad. When the termination enable signal ODTEN is activated, the termination unit 120 activates both of the pull-up termination unit and the pull-down termination unit to terminate the interface pad by using a predetermined resistance value.

Meanwhile, in the semiconductor device that does not perform the termination operation, an output enable signal OUTEN is in an inactivation state. The output enable signal OUTEN is a signal activated in the semiconductor device that outputs data when a read command is applied.

For reference, among the plurality of semiconductor devices sharing the same interface pads, the operation of the semiconductor device for outputting data will be described hereinafter. In the specifications for DRAM, the termination enable signal ODTEN is inactivated in the semiconductor device when the output enable signal OUTEN is activated. In this case, when logic 'high' data are output in the termination unit 120, only the pull-up termination is turned-on and when logic 'low' data are output, only the pull-down termination unit is turned-on. In this case, one of the pull-up termination unit and the pull-down termination unit serves as an output driver for outputting data. The exemplary embodiment of the present invention illustrates a configuration relating to the termination operation and therefore, the more detailed description of the data output will be omitted for the sake of convenience.

(2) When the semiconductor device performs the dynamic termination operation:

As described in the related art, at the time of the data input and output, the semiconductor devices, to which data are input, among the plurality of semiconductor devices sharing the interface pad, to and from which data are input and output, perform the dynamic termination operation.

The dynamic termination operation is the same as the related art when the delay lock loop is activated. A write command is applied at the time of the termination operation and, in a write period, the termination unit 120 activates the termination enable signal ODTEN in response to the termination activation information ODT and RTTN_DIS and the dynamic activation information DODT and RTTW_DIS. The dynamic activation information DODT and RTTW_DIS includes the dynamic signal DODT and the dynamic disable signal RTTW_DIS. The dynamic termination signal DODT is an activated signal when entering the write period during the termination operation. The dynamic disable signal RTTW_DIS is a signal determined by the MRS setting stored in the mode register set (MRS) and is activated when the dynamic termination operation is inactivated.

The termination control unit 110 transmits the dynamic resistance information RTTW<0:2> as the termination resistance information RTT<0:2>. The dynamic resistance information RTTW<0:2> is a signal determined by the MRS setting and represents information relating to a target resistance value for dynamically terminating the interface pad.

When the dynamic termination operation completes, the data to be written are input to the semiconductor device through the interface pad.

For reference, since the dynamic termination operation is an operation performed when the write command is applied during the termination operation, when the dynamic termination operation is performed, the termination signal ODT and the dynamic termination signal DODT are activated and the termination disable signal RTTN_DIS and the dynamic disable signal RTTW_DIS are inactivated.

The above-mentioned operations are the termination operation and the dynamic termination operation when the delay lock loop is activated. A delay lock disable signal DLL_DIS is activated when the delay lock loop is inactivated. Since the delay lock disable signal DLL_DIS becomes inactivated when the delay lock loop is activated, the termination operation is not affected by the delay lock loop. For reference, the activation of the delay lock loop may be defined by the MRS setting.

When the delay lock loop is inactivated, the dynamic termination operation will be described hereinafter.

First, when the delay lock loop is inactivated, the delay lock disable signal DLL_DIS is activated. The termination control unit 110 activates the termination enable signal ODTEN when the delay lock disable signal DLL_DIS is activated. In addition, when the delay lock disable signal DLL_DIS is activated, the termination control unit 110 transmits the dynamic resistance information RTTW<0:2> as the termination resistance information RTT<0:2>. That is, when the delay lock disable signal DLL_DIS is activated, the termination control unit 110 controls the termination unit 120 to perform the dynamic termination operation regardless of the termination activation information ODT and RTTN_DIS and the dynamic activation information DODT and RTTW_DIS.

In this case, when the semiconductor device is ready to output data and the output enable signal OUTEN is inactivated during the dynamic termination operation, the termination control unit 110 for the dynamic termination operation inactivates the termination enable signal ODTEN.

Unlike the related art, the semiconductor device in accordance with the exemplary embodiment of the present invention secures a control relating the dynamic termination operation even in the delay lock loop is inactivated. Therefore, even when the delay lock loop is inactivated, the data reflection may be reduced when the data are output from the interface pad to thereby efficiently and accurately output data. In addition, since the dynamic termination is inactivated during a period in which the data are output, the data may be normally output. Generally, when, at the time of a high-speed operation, the data are output when the delay lock loop is inactivated, there may be a problem caused thereby. However, assuming when the semiconductor device is tested under the low-frequency operation or the low-frequency environment, by employing the above control, the data may be output without any trouble when the delay lock loop is in the inactivated state.

Figure 2:
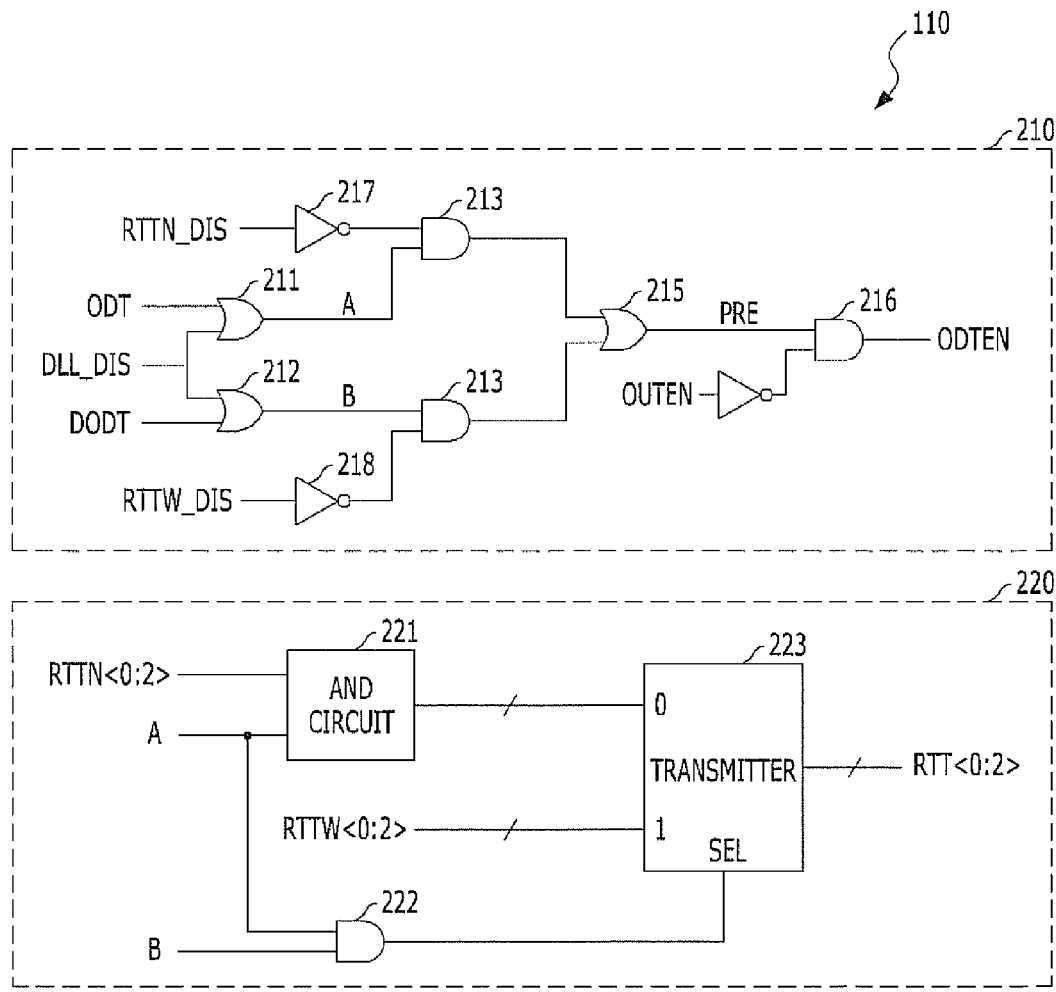
FIG. 2 is a circuit diagram of illustrating a termination control unit shown in FIG. 1.

FIG. 2 is a diagram of the exemplary embodiment of the termination control unit 110 shown in FIG. 1.

As illustrated in FIG. 2, the termination control unit 110 includes an enable signal generation unit 210 and a resistance information generation unit 220. The enable signal generation unit 210 generates the termination enable signal ODTEN in response to the termination activation information ODT and RTTN_DIS, the dynamic activation information DODT and RTTW_DIS, and the delay lock disable signal DLL_DIS. The resistance information generation unit 220 transmits the normal resistance information RTTN<0:2> or the dynamic resistance information RTTW<0:2> as the termination resistance information RTT<0:2> in response to the termination signal ODT, the dynamic termination signal DODT, and the delay lock disable signal DLL_DIS.

Hereinafter, an operation of the termination control unit 110 in accordance with the exemplary embodiment of the present invention will be described with reference to FIG. 2.

The enable signal generation unit 210 includes a plurality of logic gates 211 to 218. The enable signal generation unit 210 activates the termination enable signal ODTEN when the delay lock disable signal DLL_DIS is activated and the termination disable signal RTTN_DIS or the dynamic disable signal RTTW_DIS is inactivated, when the termination signal ODT is activated and the termination disable signal RTTN_DIS is inactivated, or when the dynamic termination signal DODT is activated and the dynamic disable signal RTTW_DIS are inactivated. However, when the output enable signal OUTEN is activated, the termination enable signal ODTEN is inactivated.

When the delay lock disable signal DLL_DIS is inactivated, a first signal A is activated through the logic gate 211 when the termination signal ODT is activated and a second signal B is activated through the logic gate 212 when the dynamic termination signal DODT is activated. If it is assumed that the termination disable signal RTTN_DIS is inactivated when the first signal A is activated, the output of the logic gate 213 is activated and thus, a preliminary signal PRE is activated via the logic gate 215. In addition, if it is assumed that the dynamic disable signal RTTW_DIS is inactivated when the second signal B is activated, the output of the logic gate 214 is activated and thus, the preliminary signal PRE is activated via the logic gate 215.

If the termination disable signal RTTN_DIS or the dynamic disable signal RTTW_DIS is inactivated when the delay lock disable signal DLL_DIS is activated, the preliminary signal PRE is activated via the above-mentioned similar process.

The activated preliminary signal PRE is outputted as the termination enable signal ODTEN when the output enable signal OUTEN is inactivated and is not transferred to the termination enable signal ODTEN when the output enable signal OUTEN is activated. That is, the enable signal generation unit 210 activates the termination enable signal ODTEN when the delay lock disable signal DLL_DIS is inactivated and inactivates the termination enable signal ODTEN when the output enable signal OUTEN is activated.

The resistance information generation unit 220 transmits the normal resistance information RTTN<0:2> as the termination resistance information RTT<0:2> when the termination signal ODT is activated and the dynamic termination signal DODT is inactivated and transmits the dynamic resistance information RTTW<0:2> as the termination resistance information RTT<0:2> when the termination signal ODT and the dynamic termination signal DODT are activated, and transmits the dynamic resistance information RTTW<0:2> as the termination resistance information RTT<0:2> when the delay lock disable signal DLL_DIS is activated.

A transmitter 223 transmits input '1' to the termination resistance information RTT<0:2> when input 'SEL' is activated and transmits input '0' to the termination resistance information RTT<0:2> when input 'SEL' is inactivated.

When the termination operation is performed, the first signal A is activated and an AND circuit 221 outputs the normal resistance information RTTN<0:2>. In this case, since the second signal B is inactivated, the input 'SEL' is inactivated and the transmitter 223 transmits the normal resistance information RTTN<0:2> as the termination resistance information RTT<0:2>.

When the dynamic termination operation is performed, both of the first and second signals A and B are activated and thus, the transmitter 223 transmits the dynamic resistance information RTTW<0:2> as the termination resistance information RTT<0:2>. Meanwhile, when the delay lock disable signal DLL_DIS is activated, both of the first and second signals A and B are activated and thus, the transmitter 223 transmits the dynamic resistance information RTTW<0:2> as the termination resistance information RTT<0:2>.

For reference, the first and second signals A and B are a signal generated from the termination control unit 210. The first signal A is a signal that logically combines the termination signal ODT and the delay lock disable signal DLL_DIS by an OR gate 211 and the second signal B is a signal that logically combines the dynamic termination signal DODT and the delay lock disable signal DLL_DIS by an OR gate 212. When the termination operation is not performed, both of the first and second signals A and B are inactivated and thus, the termination resistance information RTT<0:2> is inactivated.

The termination control circuit in accordance with the exemplary embodiment of the present invention includes the same configuration and operation as the termination unit 120 described in FIG. 1 and the description thereof will be omitted for the sake of convenience.

Figure 3:
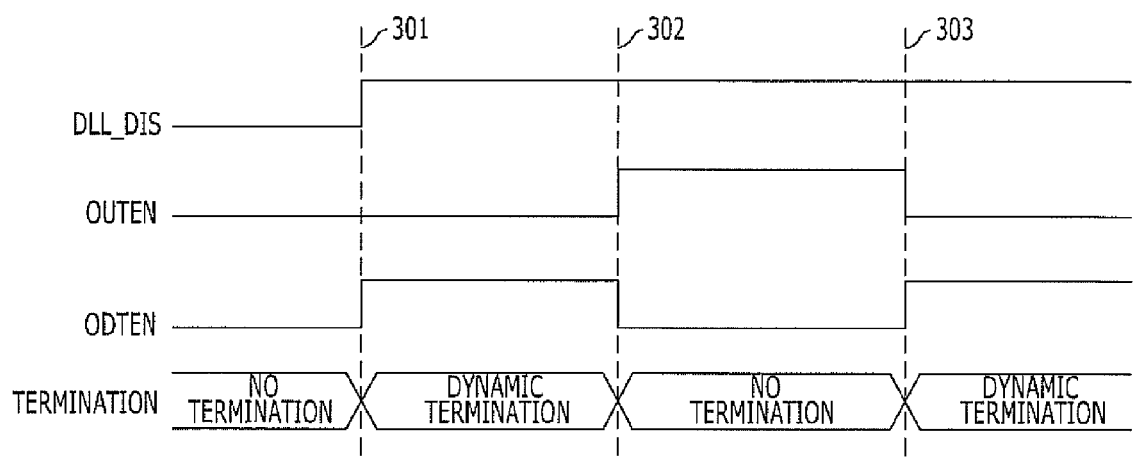
FIG. 3 is a waveform for describing a dynamic termination operation of the semiconductor device in accordance with the exemplary embodiment of the present invention.

FIG. 3 is a waveform for describing the dynamic termination operation of the semiconductor device in accordance with the exemplary embodiment of the present invention.

The exemplary embodiment of the present invention describes the semiconductor device and the termination control circuit controlling the dynamic termination when the delay lock loop is inactivated and therefore, mainly described related to the case in which the delay lock loop is inactivated.

When the delay lock loop is inactivated and thus, the delay lock disable signal DLL_DIS is activated as indicated by reference numeral '301', the termination enable signal ODTEN is activated and the dynamic termination operation is performed. In this case, when the read command is applied to the semiconductor device, the output enable signal OUTEN is activated and then the termination enable signal ODTEN is inactivated in a period between reference numerals '302' and '303' so as to output data in response to an input of the read command. When the output of the data completes and the output enable signal OUTEN is inactivated, the termination enable signal ODTEN is activated and the dynamic termination operation is performed.

That is, when the delay lock disable signal DLL_DIS is activated, the embodiment of the present invention controls the semiconductor device to perform the dynamic termination operation and inactivates the termination enable signal ODTEN in the period when the output enable signal OUTEN is activated to control the semiconductor device so that the output operation of the data may be normally performed. Through the process, the dynamic termination operation is performed even when the delay lock loop is inactivated, thereby minimizing the data reflection phenomenon when the data are input to the semiconductor device. The operation is in particular effective for the low frequency operation or the test of the semiconductor device.

As set forth above, the semiconductor device performs the dynamic termination operation when the delay lock loop is inactivated but does not perform the dynamic termination operation in the read period, thereby controlling the dynamic termination operation even when the delay lock loop is inactivated.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
a termination control unit configured to generate a termination enable signal and termination resistance information in response to termination activation information and, dynamic activation information, normal resistance information, and dynamic resistance information, wherein the termination control unit activates the termination enable signal when a delay lock loop is inactivated; and
a termination unit configured to be controlled in response to the termination enable signal and terminate an interface pad by using a resistance value determined by the termination resistance information.

2. The semiconductor device of claim 1, wherein the termination control unit is configured to activate the termination enable signal when one of a termination operation and a dynamic termination operation is performed.

3. The semiconductor device of claim 2, wherein the termination control unit is configured to transmit the normal resistance information as the termination resistance information when the termination operation is performed and transmit the dynamic resistance information as the termination resistance information when the dynamic termination operation is performed.

4. The semiconductor device of claim 1, wherein the termination control unit is configured to inactivate the termination enable signal in response to an output enable signal activated when a read command is applied.

5. The semiconductor device of claim 4, wherein the termination activation information includes a termination signal and a termination disable signal and the dynamic activation information includes a dynamic termination signal and a dynamic termination disable signal.

6. The semiconductor device of claim 5, wherein the termination control unit includes:
an enable signal generation unit configured to generate the termination enable signal in response to the termination activation information, the dynamic activation information, and a delay lock disable signal indicating whether the delay lock loop is inactivated; and
a resistance information generation unit configured to transmit one of the normal resistance information and the dynamic resistance information as the termination resistance information, in response to the termination signal, the dynamic termination signal, and the delay lock disable signal.

7. The semiconductor device of claim 6, wherein the enable signal generation unit is configured to activate the termination enable signal when the delay lock disable signal is activated and one of the termination disable signal and the dynamic termination disable signal is inactivated, when the termination signal is activated and the termination disable signal is inactivated, or when the dynamic termination signal is activated and the dynamic termination disable signal are inactivated, and inactivate the termination enable signal when the output enable signal is activated.

8. The semiconductor device of claim 6, wherein the resistance information generation unit is configured to transmit the normal resistance information as the termination resistance information when the termination signal is activated and the dynamic termination signal is inactivated and transmit the dynamic resistance information as the termination resistance information when the termination signal and the dynamic termination signal are activated, and transmit the dynamic resistance information as the termination resistance information when the delay lock disable signal is activated.

9. The semiconductor device of claim 1, wherein the semiconductor device is a memory device and the interface pad is a data input/output pad.

10. The semiconductor device of claim 9, wherein the termination disable signal, the dynamic termination disable signal, the normal resistance information, and the dynamic resistance information are determined by a mode register setting.

11. The semiconductor device of claim 1, wherein the termination signal is a signal applied from the outside of the semiconductor device and the dynamic termination signal is activated in a write operation period of the semiconductor device when the termination signal is activated.

12. A termination control circuit comprising:
an enable signal generation unit configured to generate termination enable signal in response to a termination signal, a termination disable signal, a dynamic termination signal, a dynamic termination disable signal, and a delay lock disable signal indicating whether a delay lock loop is inactivated; and
a resistance information generation unit configured to transmit one of the normal resistance information and the dynamic resistance information as a termination resistance information in response to the termination signal, the dynamic termination signal, and the delay lock disable signal.

13. The termination control circuit of claim 12, wherein the enable signal generation unit is configured to activate the termination enable signal when the delay lock disable signal is activated and the termination disable signal or the dynamic termination disable signal is inactivated, when the termination signal is activated and the termination disable signal is inactivated, or when the dynamic termination signal is activated and the dynamic termination disable signal are inactivated, and inactivate the termination enable signal when an output enable signal is activated.

14. The termination control circuit of claim 12, wherein the resistance information generation unit is configured to transmit the normal resistance information as the termination resistance information when the termination signal is activated and the dynamic termination signal is inactivated and transmits the dynamic resistance information as the termination resistance information when the termination signal and the dynamic termination signal are activated, and transmit the dynamic resistance information as the termination resistance information when the delay lock disable signal is activated.

15. The termination control circuit of claim 12, wherein the termination disable signal, the dynamic termination disable signal, the normal resistance information, and the dynamic resistance information are determined by a mode register setting.

16. The termination control circuit of claim 12, wherein the termination signal includes a signal activated at the time of the termination operation and the dynamic termination signal includes a signal activated in a write operation period of the semiconductor device when the termination signal is activated.

17. The termination control circuit of claim 12, wherein the enable signal generation unit is configured to activate the termination enable signal when the delay lock disable signal is activated and inactivate the termination enable signal when an output enable signal is activated.

18. The termination control circuit of claim 17, wherein the enable signal generation unit is configured to activate the termination enable signal for performing a dynamic termination when an output enable signal is inactivated and the delay lock disable signal is in an active state.

* * * * *